(12) United States Patent
Dinh et al.

(10) Patent No.: US 9,515,644 B2
(45) Date of Patent: Dec. 6, 2016

(54) SEMICONDUCTOR DEVICE AND CIRCUIT WITH DYNAMIC CONTROL OF ELECTRIC FIELD

(71) Applicant: NXP B.V., Eindhoven (NL)

(72) Inventors: Viet Thanh Dinh, Heverlee (BE);
Godefridus Antonius Maria Hurxk, Best (NL); Tony Vanhoucke, Bierbeek (BE); Jan Willem Slotboom, Eersel (NL); Anco Heringa, Waalre (NL); Ivan Zahariev, Nijmegen (NL); Evelyne Gridelet, Omal (BE)

(73) Assignee: NXP B.V., Eindhoven (NL)

( * ) Notice: Subject to any disclaimer, the term of this patent is extended or adjusted under 35 U.S.C. 154(b) by 50 days.

(21) Appl. No.: 14/286,418

(22) Filed: May 23, 2014

(65) Prior Publication Data

US 2014/0347131 A1 Nov. 27, 2014

(30) Foreign Application Priority Data

May 23, 2013 (EP) ..................................... 13168935
May 23, 2014 (EP) ..................................... 14169718

(51) Int. Cl.
*H03F 1/34* (2006.01)
*H03K 17/10* (2006.01)
(Continued)

(52) U.S. Cl.
CPC ............... *H03K 17/10* (2013.01); *G05F 1/462* (2013.01); *H01L 29/165* (2013.01);
(Continued)

(58) Field of Classification Search
CPC .. H01L 29/402; H01L 29/737; H01L 2924/00; H01L 29/7397; H01L 2224/48247; H01L 29/1095; H01L 2224/48137; H01L 2924/1305; H01L 29/4236; H01L 29/407; H03F 2200/129; H03F 2200/117; H03F 2203/45116; H03F 2203/45292; H03F 2203/45424; H03F 2203/45512; H03F 2203/45528; H03F 3/19; H03F 3/45179; H03F 3/45475; H03F 3/45; H03F 3/181; H03F 3/21; H03F 2200/294
(Continued)

(56) References Cited

U.S. PATENT DOCUMENTS 4,868,921 A 9/1989 Adler
6,472,939 B2 * 10/2002 Forbes ........................... 330/253
(Continued)

FOREIGN PATENT DOCUMENTS

CN 102 437 180 A 5/2012
EP 0 115 652 A1 8/1984
(Continued)

OTHER PUBLICATIONS

Young-Sang Jeon et al; "High-Efficiency Power Amplifier Using Novel Dynamic Bias Switching"; IEEE Transactions of Microwave Theory and Techniques, vol. 55, No. 4; pp. 690-696 (Apr. 2007).
(Continued)

*Primary Examiner* — Khanh V Nguyen

(57) ABSTRACT

A circuit, comprising a semiconductor device with one or more field gate terminals for controlling the electric field in a drift region of the semiconductor device; and a feedback circuit configured to dynamically control a bias voltage or voltages applied to the field gate terminal or terminals, with different control voltages used for different semiconductor device characteristics in real-time in response to a time-varying signal at a further node in the circuit.

18 Claims, 4 Drawing Sheets

(51) Int. Cl.

| | | |
|---|---|---|
| *H01L 29/40* | (2006.01) | |
| *H01L 29/732* | (2006.01) | |
| *H01L 29/165* | (2006.01) | |
| *H01L 29/737* | (2006.01) | |
| *H03F 3/19* | (2006.01) | |
| *H03F 3/21* | (2006.01) | |
| *G05F 1/46* | (2006.01) | |

(52) U.S. Cl.
CPC .......... *H01L 29/402* (2013.01); *H01L 29/737* (2013.01); *H01L 29/7327* (2013.01); *H03F 3/19* (2013.01); *H03F 3/21* (2013.01); *H03F 1/34* (2013.01); *H03F 2200/153* (2013.01)

(58) Field of Classification Search
USPC ........................................................ 330/290
See application file for complete search history.

(56) References Cited

U.S. PATENT DOCUMENTS

| | | | | |
|---|---|---|---|---|
| 6,665,354 | B1* | 12/2003 | Drapkin et al. | ............... 375/316 |
| 6,777,780 | B2 | 8/2004 | Hueting et al. | |
| 8,299,578 | B1 | 10/2012 | Babcock | |
| 8,748,238 | B2 | 6/2014 | Liu et al. | |
| 2004/0119136 | A1 | 6/2004 | Cai et al. | |
| 2008/0122519 | A1* | 5/2008 | Nowak | ......................... 327/534 |
| 2012/0299053 | A1 | 11/2012 | Mauder et al. | |
| 2013/0126945 | A1 | 5/2013 | Liu et al. | |
| 2014/0312356 | A1 | 10/2014 | Vanhoucke | |

FOREIGN PATENT DOCUMENTS

| | | |
|---|---|---|
| JP | 2003-031709 A | 1/2003 |
| JP | 2010 225797 A | 10/2004 |
| WO | 2008/026175 A1 | 3/2008 |

OTHER PUBLICATIONS

Mertens, H., et al; "Extended High Voltage HBTs in a High-Performance BiCMOS Process"; IEEE Bipolar/BiCMOS Circuits and Technology Meeting; Atlanta, GA, USA; pp. 158-161 (Oct. 2011).

Magnee, P.H.C., et al; "SiGe: C profile optimization for low noise performance"; IEEE Bipolar/BiCMOS Circuits and Technology Meeting; Atlanta, GA, USA; pp. 166-169 (Oct. 2011).

Sorge, R., et al; "Concept of vertical bipolar transistor with lateral drift region, applied to high voltage SiGe HBT"; IEEE 12$^{th}$ Topical Meeting on Silicon Monolithic Integrated Circuits in RF Systems (SiRF); pp. 223-226 (2012).

Nguyen, Chanh, et al;"The state-of-the-art of GaAs and InP power devices and amplifiers"; IEEE Transactios on Electron Devices, vol. 48, Issue 3; pp. 472-478 (Mar. 2001).

Jos, Rik; "Technology development driving an evolution of cellular phone power amplifiers to integrated RF front-end modules"; IEEE Journal of Solid-State Circuits, vol. 36, Issue 9; pp. 1382-1389 (Sep. 2001).

Partial European Search Report for application 13168935.8 (Oct. 21, 2013).

Extended European Search Report for Application No. 14169718.5 (Nov. 19, 2014).

* cited by examiner

SEMICONDUCTOR DEVICE AND CIRCUIT WITH DYNAMIC CONTROL OF ELECTRIC FIELD

CROSS-REFERENCE TO RELATED APPLICATIONS

This application claims the priority under 35 U.S.C. §119 to both European patent application no. 14169718.5, filed on May 23, 2014 and European patent application no. 13168935.8 filed on May 23, 2013, the contents of which are incorporated by reference herein.

This invention relates to a circuit including a semiconductor device such as transistors and diodes and, in particular, bipolar transistors, which make use of a control terminal (additional to the base, collector and emitter terminals, for example), for controlling the electric field distribution within a portion of the device.

In the field of data communications, there is an on-going need for power amplifiers that are able to operate at high speed. Systems of this kind typically use power amplifiers at the transmitter side to enable them to transfer the data from the circuit to the open field by electro-magnetic radiation. These high-frequency power amplifiers are designed to work at high currents and/or high voltages in order to transmit sufficient power.

Although CMOS based technologies can be used to produce high output power amplifiers, bipolar technologies remain important for providing high-efficiency, high power amplifiers at (ultra-) high frequencies. There is often a trade-off in bipolar devices between high power performance, high frequency performance and cost.

For bipolar technologies, high currents can be obtained with large-area transistors but at the cost of increasing capacitance, while the breakdown voltage of the device largely determines the maximum voltage swing during operation.

When the technical requirements for medium RF power amplifiers become more stringent in terms of output power, power gain and linearity, new designs of cost-effective devices such as bipolar transistors, heterojunction bipolar transistors (HBT), LDMOS, EDMOS or any other type of device which enables high speed in combination with high (reliable) operating voltage are required to meet these criteria. The aim would be to enable Si or SiGe HBT's with characteristics comparable to expensive GaAs transistors, both in terms of breakdown voltage and maximum speed.

It has been proposed to use control of the electric field distribution in a bipolar transistor to enhance the trade-off between breakdown voltage and other device characteristics, for example as disclosed in U.S. Pat. No. 6,777,780.

The structure described has a drift region, and one or more gate contacts, which enable shaping of the electric field in the drift region proximal to an active part of the device (e.g. base emitter region for a bipolar device or a channel region for a MOS-type device). This enables a uniform electric field to be shaped which enables the range over which the field is constant to be varied. As such the setting point for the trade-off between various device characteristics can be set. In particular the electric field can be dynamically shaped, in real-time, to achieve advantageous semiconductor device performance.

In one example, the structure described has a drift region, and one or more gate contacts, which enable shaping of the electric field in the collector region proximal to the base region. This enables a uniform electric field to be shaped enables the range over which the field is constant to be varied. As such the setting point for the trade-off between various bipolar transistor characteristics can be set.

According to the invention, there is provided a circuit, comprising:

a semiconductor device with one or more field gate terminals for controlling the electric field in a drift region of the semiconductor device;

a feedback circuit configured to dynamically control the bias voltage or voltages applied to the field gate terminal or terminals, with different control voltages used for different semiconductor device characteristics in real-time in response to a time-varying signal at a further node in the circuit.

The ability to provide different transistor characteristics by dynamically setting a control voltage enables the performance of the semiconductor device to be modified in real time. The dynamic or "real-time" control or biasing can be applied to the gate terminal or terminals and follow another time-dependent signal such as an output voltage swing signal, a power envelope signal or any other time varying signal. The real-time modification of the bias voltage during operation of the semiconductor device is advantageous.

Depending on the configuration, the requirement of breakdown voltages (BV) and speed (cut-off frequency fT or any other RF parameter which describes the speed of the device depending on the type of application, e.g. fMAX, fa) for these semiconductor devices can be dynamically controlled. The control voltage on the field-shaping part of the transistor (e.g. the gate(s)) being dynamically controlled in real-time, i.e. the voltage at the gate is directly related to the voltage at another node of the device or circuit at any point in time during the RF operation is advantageous. By biasing the gate terminal real-time, the power capability/performance of the device can be extended during the RF operation by pushing or optimizing the load line outwards depending on the current-voltage combination that the transistor experiences at that particular point in time of the RF swing so that both the maximum voltage (such as $V_{CE,MAX}$) and maximum current (such as $I_{C,MAX}$) can be increased. The circuit can be tuned to a particular application or even to a particular operation condition depending on the actual RF swing at the drift region by selecting the bias voltage under dynamic, real-time conditions.

The semiconductor device may comprise a transistor, such as a bipolar junction transistor or MOS transistor (LDMOS or EDMOS for example). The semiconductor device may comprise a diode. The transistor may have a plurality of terminals and the field gate terminal or terminals for dynamically controlling the electric field in the drift region or active region of the transistor. For example, the transistor may comprise a bipolar transistor and comprise a base, collector and emitter terminal and the field gate terminal or terminals may be configured to dynamically control the electric field in a collector region (which comprises the drift region). The dynamic control may be in dependence on a collector-emitter or base-emitter voltage of the bipolar transistor. As a further example, the transistor, such as a FET, may include a source, drain and gate terminal and the field gate terminal or terminals may be configured to dynamically control the electric field in a channel region (which comprises the drift region). The field gate terminal or terminals may for part of or all of the gate terminal of the transistor.

The time-varying signal used by the feedback circuit to control the bias voltage may comprise a collector-emitter or base-emitter voltage if the semiconductor device comprises a bipolar transistor or a source-drain voltage or gate-source voltage if the semiconductor device is of MOS-type or an input or output voltage to the circuit. If the semiconductor device comprises a diode, a time-varying voltage applied to a terminal of the diode may be used.

The feedback circuit preferably comprises a signal processing unit configured to generate a bias voltage which relates to the time-varying signal. In this way, by an appropriate field shaping at any point in time during operation of the device, a high breakdown (for reliable high voltage operation) or high current (for smaller collector emitter voltage) can be achieved. It will be appreciated that the term "breakdown voltage" comprises the maximum voltage at which the transistor is still capable of reliable operation.

The feedback circuit may comprise an inverter connected between an output terminal (e.g. collector for a bipolar transistor) or input terminal (e.g. base for a bipolar transistor) or a combination of both of the semiconductor device and the field gate terminal.

The feedback circuit may be configured to determine the bias voltage or voltages based on a time varying load mismatch signal. This is advantageous as a further node can be provided from which a time-varying signal of load mismatch can be derived and the feedback circuit may dynamically control the bias voltage(s) applied to the semiconductor device.

The dynamic real-time control is preferably at the frequency of operation (or a derivative of the frequency of operation) of the device so that it can respond dynamically to the load conditions.

The circuit may be used in an RF power amplifier.

The invention also provides a method of controlling a semiconductor device comprising one or more field gate terminals for controlling the electric field in a drift region of the semiconductor device, wherein the method comprises:

dynamically controlling the bias voltage or bias voltages applied to the field gate terminal or terminals to achieve different transistor characteristics in real-time in response to a time-varying signal at a further node in the circuit.

We also disclose a transistor circuit, comprising: a bipolar transistor comprising a base, collector and emitter, and at least one gate terminal for controlling the electric field in a collector region of the transistor; a control circuit for controlling a bias voltage or bias voltages applied to the gate terminal or gate terminals, with different control voltages used for different transistor characteristics.

The circuit optionally comprising: at least first and second first transistor circuits, wherein the transistors of the first and second first transistor circuits are identical and have different bias voltages applied to them to achieve different transistor characteristics.

The circuit optionally comprising a feedback circuit for dynamically controlling a bias voltage applied to the gate terminal in dependence on a collector emitter or base-emitter voltage of the bipolar transistor.

Optionally the feedback circuit comprises an inverter connected between the collector and gate terminal.

Optionally the dynamic control is at the frequency of operation of the bipolar transistor.

Optionally the circuit comprises an RF power amplifier.

We also disclose a method of controlling a bipolar transistor comprising a base, collector and emitter, and at least one gate terminal for controlling the electric field in a collector region of the transistor, wherein the method comprises:

controlling a bias voltage or bias voltages applied to the gate terminal or terminals to achieve different transistor characteristics.

Optionally the method comprises controlling first and second first transistor circuits, wherein the transistors of the first and second first transistor circuits are identical, and the method comprises applying different bias voltages to the transistor of the first and second first transistor circuits to achieve different transistor characteristics.

Optionally the method comprises dynamically controlling a bias voltage applied to the gate terminal in dependence on a collector emitter voltage of the bipolar transistor.

Optionally the method comprises generating a bias voltage from an inverted version of the collector voltage.

Optionally the dynamic control is at the frequency of operation of the bipolar transistor.

Examples of the invention will now be described in detail with reference to the accompanying drawings, in which.

The invention provides a circuit comprising a semiconductor device, which may, in one embodiment, comprise a transistor such as a bipolar transistor. In the following examples the semiconductor device comprises a bipolar transistor having one or more gate terminals for dynamically controlling the electric field in a collector region of the transistor in real time. The bias voltage or voltages applied to the gate terminal or terminals are dynamically controlled to achieve different transistor characteristics based on a time varying variable of the circuit. It will be appreciated that the invention has application to other types of transistor, such as MOS-type transistors (e.g. LDMOS, EDMOS etc) and diodes.

In one example not forming part of the invention the control is static, so that different identical transistors in a circuit can have different (fixed) characteristics. In another example in accordance with the invention, a feedback circuit dynamically controls a bias voltage applied to the field gate terminal in dependence on an output voltage or collector-emitter voltage or an input voltage or base-emitter voltage of the transistor. This enables the transistor performance to be tuned in real time to the dynamically varying collector voltages (i.e. electric fields) or load requirements.

Figure 1:
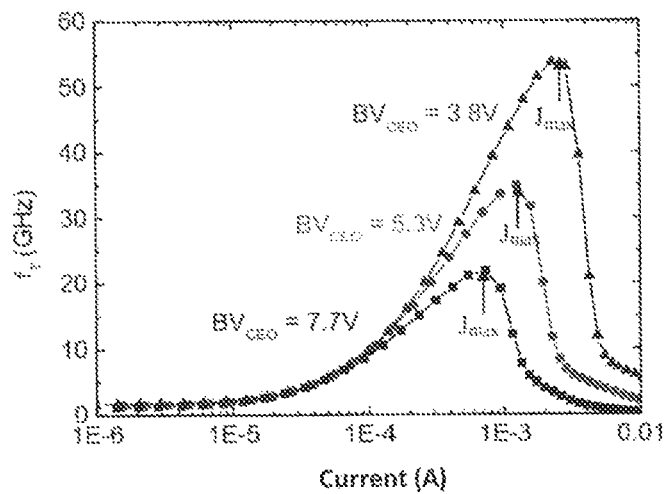
FIG. 1 shows the trade-off between breakdown voltage and frequency of different high-voltage devices such as a SiGe heterojunction bipolar transistors (HBTs)

High-voltage devices (such as Bipolar (or heterojunction bipolar) transistors) are currently used for RF power amplifiers at high frequencies thanks to their good RF characteristics. For such applications, a high-breakdown device is usually preferred allowing high voltage swing at the output (for high output power). However, high voltage devices usually have their limitations, which include:

(i) A low speed. There is always a trade-off between breakdown voltage and speed: a high-breakdown voltage device has a low $f_T$ (the frequency at which the current gain is unity) and vice versa. FIG. 1 shows a general example of such a trade-off and shows different devices of different breakdown voltages, such as collector emitter breakdown voltage (BVceo).

(ii) Current limitations. As can be seen FIG. 1, there is a relation between speed (fT) and maximum current (i.e. current at peak fT). This current is shown as $J_{MAX}$. It means that the high-voltage device suffers also from a lower $J_{MAX}$, which makes the power capability of the device also lower.

In practice, different breakdown voltages and fT values for different application requirements are obtained by changing the process for the drift region or, in the case of a bipolar transistor, the collector profile (i.e. implantation dose, implementation energy, diffusion time and temperature). This complicates the process or increases its cost and limits the flexibility of the designer in implementing ICs.

As mentioned above, it has been proposed to use one or more gate biases to increase the flexibility and power capability for power devices.

This invention will be described in connection with a particular bipolar transistor design which will now be described. The invention is however not limited to the particular transistor shown.

Figure 2:
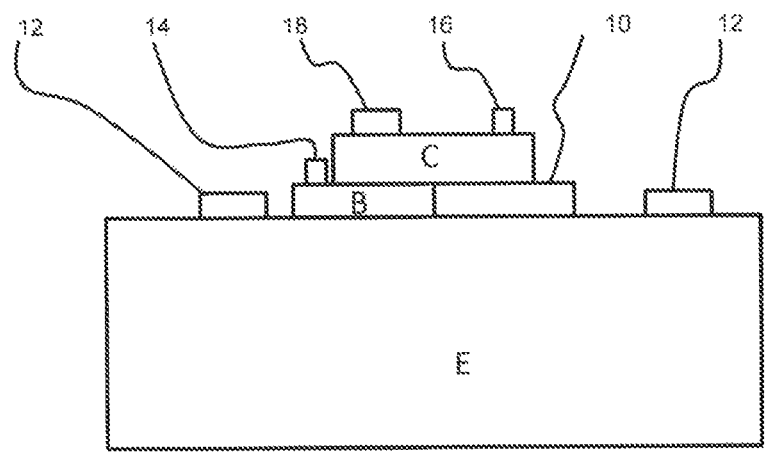
FIG. 2 shows a first example in which the semiconductor device comprises a bipolar transistor structure to which the invention can be applied.

FIG. 2 shows one example of bipolar transistor structure to which the invention can be applied. The method of the invention of using an extra terminal (for example to dynamically extend the power capability of the device in real-time) can be applied to any device provided there is a terminal or field plate that is coupled to the drift region of the device for modification of the field. The structure of FIG. 2 is one example.

The transistor has an emitter E, a base B and a collector C. The emitter E is formed in the bulk of the substrate of the device. The emitter E could also be formed as a layer above the surface of the substrate.

The base B is provided as a layer of semiconductor material over the emitter E. The layer forming the base B can be deposited and patterned using standard lithographic techniques, to provide the desired dimensions and alignment with respect to the emitter E. The collector C can also be provided as a patterned layer of semiconductor material, dimensioned and aligned with respect to the base as desired.

In the example structure of FIG. 2, the collector C extends laterally in a plane substantially parallel to the major surface of the substrate. The collector C overlaps the base B (thereby to make contact therewith), but also extends past an edge of the base B and away from the overlapping region. To prevent a short circuit of the base B a dielectric 10 is provided beneath the overhang portion of the collector C to ensure that this portion of the collector C does not make contact with the emitter E. The collector C is formed at the "top" of the device (i.e. above the emitter E and the base B). The emitter E, base B and collector C are each provided with corresponding emitter contact(s) 12, base contact(s) 14 and collector contact(s) 16 The collector C is provided with a field gate comprising collector gate 18.

The purpose of the collector gate 18 is to shape the electric field within the collector C. The collector gate is thus a field gate terminal of the device, in addition to the conventional base, emitter and collector terminals. It functions as a field plate. In this way, the peak electric field within the collector C can be dynamically suppressed, thereby improving still further the breakdown voltage of the device. This field shaping in this device thus makes use of a collector gate in a bottom-up bipolar transistor having a lateral collector.

Although a small gate is shown schematically in FIG. 2, in principle the gate can also be extended laterally over the entire collector region. This can give improved field shaping. It will be appreciated that any other field-plate configuration can be included.

This invention relates to biasing of the field gate, and it can be applied to different transistor designs, such as vertical transistors. It can be applied to any structure which implements a field gate to enable field shaping in the drift region.

In high-power devices, it is known that a field plate can be used to reshape the field distribution. With a suitable bias, an accumulation layer can be formed under the field plate, which can be used for enhancing $f_T$ and current.

In order to understand the behaviour of the accumulation layer under different field plate bias ($V_G$) for the field plated-collector of FIG. 2 a CAD model has been used.

Figure 3:
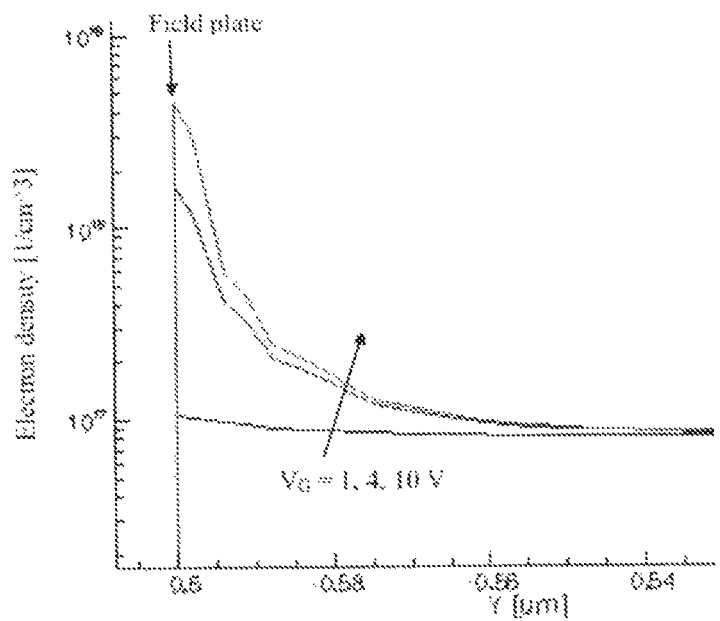
FIG. 3 shows how the accumulation layer under a collector field plate changes with various gate voltages at the ON state.

The impact of field plate voltage has then been investigated at ON and OFF states:

In the ON state (for example: $V_{CE}$=1V, VBE=0.7V): when $V_G$ increases from 1V to 10V, the accumulation layer under the field plate starts to increase and extend under the whole field plate (to a saturation level). FIG. 3 shows how the accumulation layer under the field plate (at X=−0.5 μm) changes with various gate voltages at the ON state. This accumulation layer can be considered as a thin collector (i.e., virtually moving the collector closer to the base), which helps delay the onset of the Kirk effect and increase $f_T$. In brief, high $f_T$ and low BVceo are obtained at high $V_G$.

Figure 4:
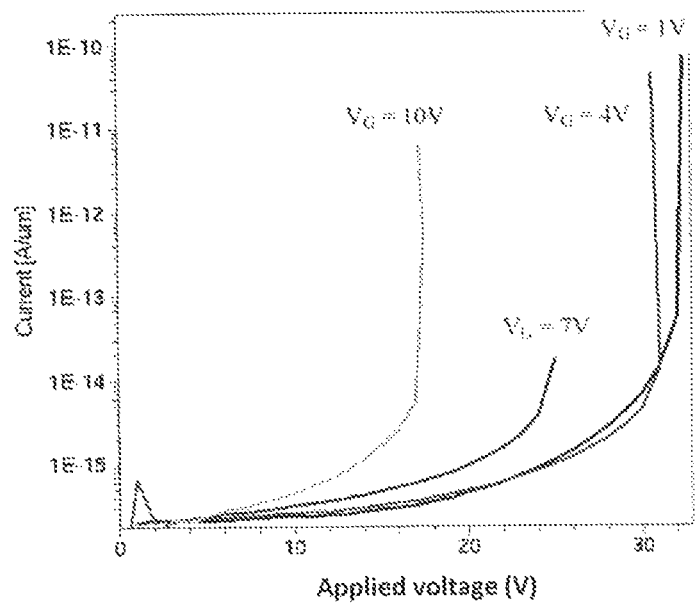
FIG. 4 shows the value of a transistor current as a function of the applied voltage at various values of the field plate voltage.

In the OFF state ($V_{CE}$=1V, VBE=low voltage for example 0V): when $V_G$ increases from 1V to 10V, the breakdown BVcbo is reduced, which can be explained as follows. At a low $V_G$ and high $V_{CE}$, the field is pushed away from the base-collector junction (or lines of equi-potential are pushed further to the end of collector), which is beneficial for a high breakdown. When $V_G$ is increased, that effect is reduced (e.g. the collector is depleted slower) which makes the breakdown voltage lower. FIG. 4 shows the value of BVcbo at various values of the field plate voltage $V_G$. ($V_G$=1, 4, 7, 10 V).

The transistor has two main important figures of merit: breakdown voltages (BVcbo) and cut-off frequency (fT). While BVcbo is determined at the OFF-state condition, fT is determined at ON-state condition. In a method which dynamically changes breakdown voltages (BV) and Ft in real-time, an analysis of the effect of bias at these ON and OFF states is relevant. The bias conditions mentioned above for ON and OFF states (e.g., VCE=1V, VBE=0.7V; VCE=1V, VBE=0V) are of course simply a typical example of biasing for a silicon-based bipolar transistor. Other bias conditions are possible.

There are various applications of this control of the accumulation layer.

A first application is to create a single design of device with various values of $f_T$ and breakdown voltage. This can be considered to be a static implementation not forming part of the invention, in which different transistors in a multiple-transistor circuit are biased to provide different transistor characteristics.

By making use of the effect described above relating to the accumulation layer, one device can be made with an $f_T$ and breakdown (BVceo and BVcbo), which can be adjusted by varying only the field-plate bias.

Figure 5:
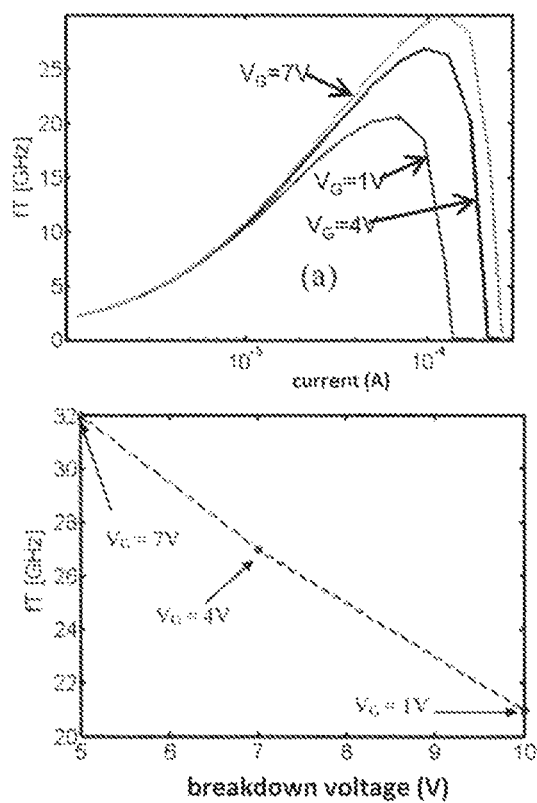
FIG. 5 shows an adjustable relationship between frequency and breakdown voltage with varied field-plate voltages.

FIG. 5 shows an adjustable $f_T$/BVceo with varied field-plate voltages.

As shown in FIG. 5, by increasing $V_G$ from 1V to 7V, BVceo is reduced from 9.5V to 5V; and then $f_T$ increases from 20 to 32 GHz.

This shows that depending on the gate biasing it is possible to trade-off fT with BV (most clearly seen in FIG. 5b).

By adapting the gate voltage, the breakdown voltage and $f_T$ and $f_{MAX}$ can be adapted (with fT and $f_{MAX}$ going up when BV is going down). As such, the same design of device can be used either as a lower-frequency-higher-voltage device or as a high-frequency-lower-voltage device.

In the static implementation, a DC bias is applied to the gate which can be a single gate or a gate which is by split into parts. One or more gates can be used for optimal field shaping. A gate part closer to the base-collector junction can be used to shape the field for control of the breakdown. Different gates can be provided with different static bias levels.

A designer can have more flexibility to apply a given transistor type to the desired application. If it is a wireless infrastructure application, the supply voltages can be as high as 5V or 9V, while frequency bands are 900 MHz, 2.1 GHz, 2.4 GHz, 3.5 GHz and 5.8 GHz.

In this way, separate technologies are no longer needed for different frequency bands—for example, one for frequencies below 2.7 GHz and another for frequencies above 2.7 GHz.

In summary, the technology using gated devices such as the HBT of the example can cover:

(i) High gain at different frequency bands (wide band design) at a fixed breakdown.

(ii) High linearity over frequency and wide band (because of high $f_T$) by using negative feedback designs with high loop gain.

(iii) The field-plated device can be universal for different applications. Depending on application requirements, it can be used with high supply voltages to obtain high linearity, power levels or efficiency.

(iv) More design flexibility is provided, as the field-plated device can be used with different $V_G$, which is dependent on the design topology.

A further application in accordance with the invention is to enable selection of a particular load line for devices in a dynamic or real time way based on a time varying signal of the circuit.

The power capability (and also linearity) of power amplifiers is determined by the maximum voltage (e.g. BVceo or BVcbo in a bipolar transistor) and maximum current.

Figure 6:
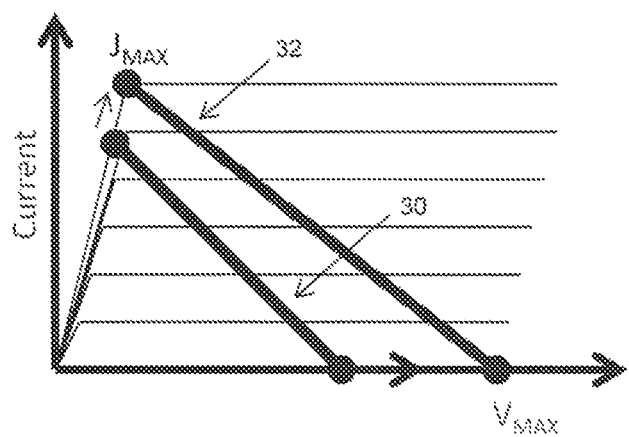
FIG. 6 shows how dynamic switching of the field-plate allows to use a different load line which is more in favour for better power operation.

FIG. 6 shows how the load line can be shifted by biasing the field-plate in real-time (at the same speed as collector).

The desired load line can be selected by the dynamic switching approach. With a better load line, better linearity, output power or efficiency can be obtained as well.

This means that in a first region (shown as Region I), where a high breakdown is needed, a small $V_G$ is applied and a high reliable breakdown voltage (such as BVceo and also BVcbo) can be obtained. In a second region (shown as Region II), where a high current is needed, a large $V_G$ is applied (breakdown is not important here).

FIG. 6 shows two load lines 30,32. The original load line is shown as 30 and the improved load line under dynamic or real time switching is shown as 32.

The biasing does not change the load line, instead the load line is a choice made by the designer.

Starting with a given transistor, the designer chooses a load which fits the requirements and generates enough power and linearity. This means that the loadline is fixed and determined by the load impedance, e.g. loadline 30. However, to have improved performance (e.g. more power) the designer would like to use a different load impedance to end up with the loadline 32, but the loadline 32 crosses the breakdown voltage limit (V,MAX on x axis) and the maximum current (JMAX on y axis).

The dynamic real-time control of the invention enables the designer not to be contrained by the maximum voltage and maximum current, so that a load impedance can be used that gives loadline 32, even if the breakdown voltage or maximum current of the transistor is lower than the corresponding V,MAX and JMAX. The transistor can be tuned to allow more current or voltage if the transistor is kept in the correct position on the loadline.

In a standard transistor, the designer can only use load line 30 because of the maximum V,max and Jmax values.

The dynamic real-time biasing approach enables the designer to use load line 32 because with the circuit operated with the correct dynamic biasing, both V,max and Jmax will shift, and the transistor will adapt its point of operation in real time to remain at a suitable point on the selected loadline.

The power and linearity performance of power amplifiers is limited by Jmax and V,max (of the transistor). The invention enables both Jmax and V,max to be increased. The power and linearity performance of the power amplifier by enabling the user of load line 32 will be better than when there is only the choice of load line 30

This way of biasing the field plate means the power capability of the device can be extended by pushing the load line further to the right hand side, i.e. both $V_{,MAX}$ and $I_{,MAX}$ can be increased. This enhancement is a large advantage to the current status of power (high-voltage) devices, where $I_{MAX}$ is often traded off versus $V_{MAX}$.

This approach can be applied in mobile phone power amplifiers. Since these amplifiers are adaptively biased to get more effective current consumption and high power efficiency, $V_G$ can be regulated so that whenever the power amplifier transistor experiences a high $V_{out}$ (peak-to-peak), the high output voltage can be detected and $V_G$ can be reduced in order to increase the breakdown voltage.

Power amplifiers tend to work sometimes with a mismatch at the output, i.e. the real or imaginary parts of the load can vary. Thus the output voltage swings can increase substantially and some part of the power is reflected back to the power amplifier. Only a certain part of the power is still transmitted to the load. In this case a fast detection could set up a low $V_G$, extend the breakdown and the transmission would be supported without any breakdown. In a power amplifier, a very high $V_{MAX}$ (or $BV_{CBO}$ in the case of a bipolar transistor) is needed, for example 3 times larger than the operating voltage, to withstand very high output voltages in some unexpected cases of mismatch. However, using a high breakdown voltage transistor just these cases, there is a consequent sacrifice of other features (e.g. high fT or Jmax). The dynamic switching method can be used with detection of the mismatch case, and immediately the gate voltage can be lowered. In this way, a higher BV can be tolerated, whereas in normal situations, we can a higher VG is used. Thus, real is time control of the bias voltage is advantageous.

Figure 7:
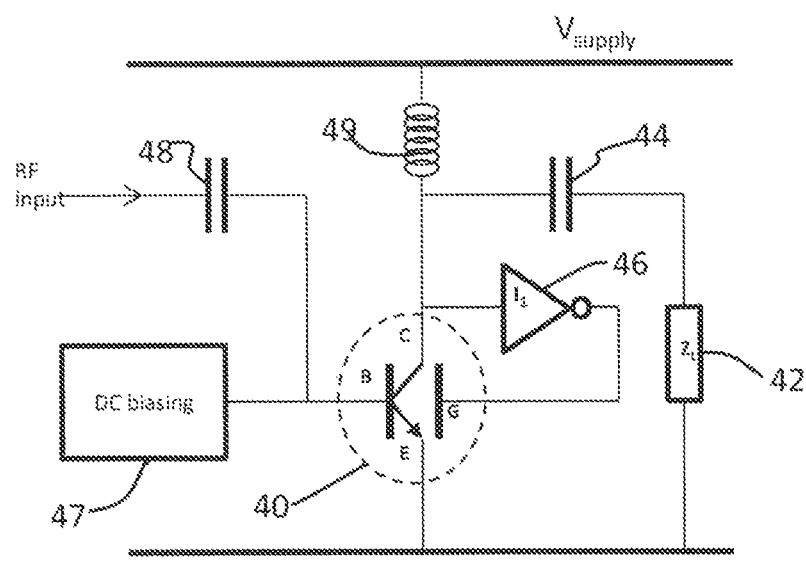
FIG. 7 shows an example of how to implement dynamic or real-time field plate voltage control in a power amplifier for a semiconductor device comprising a bipolar transistor.

An example of implementing dynamic real-time switching operation in a power amplifier is shown schematically in FIG. 7.

FIG. 7 shows the power transistor 40 with the field plate gate G. There are thus four device terminals: base (B), emitter (E), collector (C) and gate (G). A substrate contact is also possible, but not essential. The (complex) load 42 is connected to the collector via a DC blocking capacitor 44. The transistor base is DC biased by a bias circuit 47 and the RF input is supplied through a decoupling capacitor 48.

A choke inductor 49 is connected between the power supply line and the transistor 40. The choke 49 is used for decoupling DC and AC signals.

This is just one way of operating a power transistor, many other configurations are possible and the dynamic real-time switching of the invention can again be applied.

The gate biasing is implemented by a high-speed inverter 46 which probes the collector-emitter voltage of the power transistor in real-time and sends this inverted signal to the gate of transistor 40. In this way, the gate biasing is low in the case of a high $V_{CE}$ (region I in FIG. 6) while it is high for low $V_{CE}$ (region II in FIG. 6). Thus, the collector forms further node from which the time-varying signal is received. The base-collector voltage can also be used as the feedback parameter.

There are other ways of sensing a voltage on the transistor and feeding it to the gate. For example, the base current can be probed or the voltage swing. Since there is a relation between base and collector current and voltages, probing the base could also be used to bias the gate.

Sensing the output signal in a real-time mode for power amplifiers at high frequencies (GHz range) has been demonstrated for example in Young-Sang Jeon et al., "High-Efficiency Power Amplifier Using Novel Dynamic Bias Switching", IEEE Transactions of Microwave Theory and Techniques, vol. 55, No. 4, April 2007 for class-E type operation.

Other power amplifiers configurations are possible as well but have a similar way of dynamic real-time gate-biasing as shown schematically in FIG. 7.

For example, as mentioned above, the gate can be physically split in one or more sections (i.e. more gates next to each other on the same collector region) with every section individually dynamically biased (although a subset may be static biased) depending on the application requirements or device operation.

The invention thus provides an approach for dynamically biasing the field plate of bipolar devices to enable a dynamic real time change (i.e. adjustability) of device characteristics and their trade-off such as breakdown voltage (BVcbo/BVceo) vs. frequency ($f_T/f_{MAX}$). This extends the power capability and linearity of the device by varying $V_G$ in real time, for example at the same speed as the collector-emitter voltage swing.

It will be appreciated that the semiconductor device 40 of FIG. 7 may comprise a MOS transistor and comprise a source terminal in place of the collector terminal, a drain terminal in place of the emitter terminal and a gate terminal in place of the base terminal. The invertor 46 may be configured to apply the bias signal to a field plate gate terminal to dynamically modify the electric field in the conduction channel of the transistor. In a further example the semiconductor device 40 may comprise a diode having an anode and a cathode and a gate field plate. The DC bias 47 may not be present in this example.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A circuit, comprising:
   a semiconductor device with one or more field gate terminals configured to control an electric field in a drift region of the semiconductor device, wherein the semiconductor device comprises a bipolar transistor having base, collector, and emitter terminals; and
   a feedback circuit configured to dynamically control one or more bias voltages applied to the one or more field gate terminals, with different control voltages used for different semiconductor device characteristics in real-time in response to a time-varying signal at the collector terminal.

2. The circuit as defined in claim 1, wherein the one or more field gate terminals are configured to dynamically control the electric field in a collector region.

3. The circuit as defined in claim 1, wherein the time-varying signal used by the feedback circuit to control the one or more bias voltages comprises a collector-emitter voltage.

4. The circuit as claimed in claim 1, wherein the feedback circuit comprises an inverter connected between an output of the semiconductor device and the field gate terminal.

5. The circuit as defined in claim 1, wherein the feedback circuit is configured to determine the one or more bias voltages based on a time varying load mismatch signal.

6. The circuit as claimed in claim 1, wherein the real-time control is dynamically applied at a frequency of operation of the semiconductor device.

7. The circuit of claim 1, wherein the emitter terminal is located in a substrate of the semiconductor device.

8. The circuit of claim 1, wherein the emitter terminal is located in a layer above a substrate of the semiconductor device.

9. The circuit of claim 1, wherein the one or more field gate terminals are configured to dynamically suppress a peak electric field in the collector terminal.

10. The circuit of claim 1, wherein the one or more field gate terminals are configured to control a breakdown voltage of the bipolar transistor.

11. The circuit of claim 1, wherein the one or more field gate terminals are configured to control a cut-off frequency of the bipolar transistor.

12. The circuit of claim 1, wherein the bipolar transistor further comprises a substrate contact.

13. The circuit of claim 1, further comprising:
    a choke inductor coupled between a power supply and the bipolar transistor.

14. The circuit of claim 1, wherein the time-varying signal used by the feedback circuit to control the one or more bias voltages comprises a base-collector voltage.

15. A radio frequency (RF) power amplifier comprising the circuit as claimed in claim 1.

16. An electronic device including the circuit of claim 1.

17. A method of controlling a semiconductor device comprising one or more field gate terminals for controlling an electric field in a drift region of the semiconductor device, wherein the method comprises:
    dynamically controlling a bias voltage applied to the one or more field gate terminals to achieve different transistor characteristics in real-time in response to a time-varying signal at a collector terminal by a feedback circuit, wherein the semiconductor device comprises a bipolar transistor having base, collector, and emitter terminals.

18. The method as claimed in claim 17, further comprising:
    dynamically controlling the bias voltage applied to the field gate terminal in dependence on a collector-emitter voltage of the bipolar transistor.

\* \* \* \* \*